United States Patent
Miyoshi et al.

(10) Patent No.: US 7,564,242 B2
(45) Date of Patent: Jul. 21, 2009

(54) MR DATA ACQUISITION METHOD, MR IMAGE CONSTRUCTION METHOD, AND MRI SYSTEM

(75) Inventors: Mitsuharu Miyoshi, Tokyo (JP); Aki Yamazaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 12/049,776

(22) Filed: Mar. 17, 2008

(65) Prior Publication Data

US 2008/0157763 A1  Jul. 3, 2008

Related U.S. Application Data

(62) Division of application No. 11/049,485, filed on Feb. 1, 2005, now Pat. No. 7,365,537.

(30) Foreign Application Priority Data

Feb. 18, 2004  (JP) ............... 2004-040695

(51) Int. Cl.
*G01V 3/00* (2006.01)

(52) U.S. Cl. ...................... 324/307; 324/309

(58) Field of Classification Search ............... 324/307, 324/309
See application file for complete search history.

(56) References Cited

U.S. PATENT DOCUMENTS

| | | | | |
|---|---|---|---|---|
| 6,339,332 | B1 * | 1/2002 | Deimling | 324/309 |
| 7,199,583 | B2 * | 4/2007 | Ikezaki | 324/309 |
| 7,253,620 | B1 * | 8/2007 | Derbyshire et al. | 324/307 |
| 7,365,537 | B2 * | 4/2008 | Miyoshi et al. | 324/307 |
| 7,449,884 | B1 * | 11/2008 | Cukur et al. | 324/307 |
| 2005/0171422 | A1 * | 8/2005 | Zhang | 600/410 |
| 2005/0179432 | A1 | 8/2005 | Miyoshi et al. | |

FOREIGN PATENT DOCUMENTS

JP  352945  8/1992

* cited by examiner

*Primary Examiner*—Louis M Arana
(74) *Attorney, Agent, or Firm*—Armstrong Teasdale LLP

(57) ABSTRACT

An MR data acquisition method for acquiring data D_$\phi$fat according to a steady-state pulse sequence specifying that a phase of an RF pulse is varied in order of 0, 1×$\phi$fat, 2×$\phi$fat, etc., wherein $\phi fat = (2 - TR/T\_out + 2 \times m) \times \pi$ is established on an assumption that m denotes an integer equal to or larger than 0 and meets $TR/(2 \times T\_out) - 1 < m < TR/(2 \times T\_out)$ where TR denotes a repetition time and T_out denotes a time during which spins in water and spins in fat are out of phase with each other due to chemical shifts.

4 Claims, 27 Drawing Sheets

FIG. 5

```
START image construction
          ↓
Construct MR image Gw using data D_φ fat   — B1
          ↓
         END
```

FIG. 6

TR = 0.5 × T_out    m = 0, φ fat = $\frac{3}{2}\pi$

| Change in the phase of an RF pulse |
|---|
| - 0 - $\frac{3}{2}\pi$ - $\frac{6}{2}\pi$ - $\frac{9}{2}\pi$ - 0 - $\frac{3}{2}\pi$ - |

| | | Echo induced by water | Echo induced by fat |
|---|---|---|---|
| D_φ fat | | Ew ↗ SE / GRE → | GRE → / Ef SE |
| Relative phase of a spine echo component | φ fat - π - φ chem | π / 2 | − π |
| Relative chemical shift | φ chem | 0 | φ fat |

FIG. 7

TR = 3.5 × T_out    m = 1, $\phi$ fat = $\frac{1}{2}\pi$

| Change in the phase of an RF pulse |
|---|
| - 0 - $\frac{1}{2}\pi$ - $\frac{2}{2}\pi$ - $\frac{3}{2}\pi$ - 0 - $\frac{1}{2}\pi$ - |

|  | Echo induced by water | Echo induced by fat |
|---|---|---|
| D_$\phi$ fat | GRE, SE, Ew | GRE, Ef, SE |
| Relative phase of a spine echo component | $\phi$ fat - $\pi$ - $\phi$ chem | $-\pi/2$ | $-\pi$ |
| Relative chemical shift | $\phi$ chem | 0 | $\phi$ fat |

FIG. 13

$TR = 0.5 \times T\_out \quad m = 0, \phi\, fat = \frac{3}{2}\pi$ $\phi\, center = \phi\, fat = \frac{3}{2}\pi \quad \phi\, step = \frac{1}{4}\pi$ $\phi 1 = \frac{7}{4}\pi$

| Change in the phase of an RF pulse |
|---|
| $-0 - \frac{7}{4}\pi - \frac{14}{4}\pi - \frac{21}{4}\pi - \frac{28}{4}\pi - \frac{35}{4}\pi - \frac{42}{4}\pi - \frac{49}{4}\pi - 0 - \frac{7}{4}\pi -$ |

| | | Echo induced by water | Echo induced by fat |
|---|---|---|---|
| D_$\phi$1 | | Ew1 / SE / GRE | GRE / Ef1 \ SE |
| Relative phase of a spine echo component | $\phi 1 - \pi - \phi\, chem$ | $3\pi / 4$ | $-3\pi / 4$ |
| Relative chemical shift | $\phi\, chem$ | 0 | $\phi\, fat$ |

FIG. 14

$TR = 0.5 \times T\_out \quad m = 0, \phi\,fat = \frac{3}{2}\pi$ $\phi\,center = \phi\,fat = \frac{3}{2}\pi \quad \phi\,step = \frac{1}{4}\pi$ $\phi 2 = \frac{5}{4}\pi$

| Change in the phase of an RF pulse |
|---|
| $-0-\frac{5}{4}\pi-\frac{10}{4}\pi-\frac{15}{4}\pi-\frac{20}{4}\pi-\frac{25}{4}\pi-\frac{30}{4}\pi-\frac{36}{4}\pi-0-\frac{5}{4}\pi-$ |

| | | Echo induced by water | Echo induced by fat |
|---|---|---|---|
| $D\_\phi 2$ | | Ew2, SE, GRE | Ef2, SE, GRE |
| Relative phase of a spine echo component | $\phi 2 - \pi - \phi\,chem$ | $\pi/4$ | $3\pi/4$ |
| Relative chemical shift | $\phi\,chem$ | 0 | $\phi\,fat$ |

FIG. 15
| $\phi$ sum = $\phi$ step = $\frac{1}{4}\pi$ | Echo induced by water | Echo induced by fat |
|---|---|---|
| exp (i x $\phi$ sum) x D_$\phi$2 | 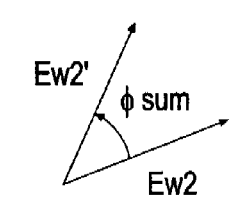 | 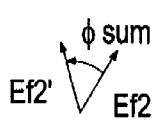 |
FIG. 16
| | Echo induced by water | Echo induced by fat |
|---|---|---|
| D w<br><br>D_$\phi$1 + exp (i x $\phi$ sum) x D_$\phi$2 |  |  |
| D f<br><br>D_$\phi$1 − exp (i x $\phi$ sum) x D_$\phi$2 |  |  |

FIG. 17

TR = 3.5 × T_out    m = 1, φ fat = $\frac{1}{2}\pi$

φ center = φ fat = $\frac{1}{2}\pi$    φ step = $\frac{1}{4}\pi$

φ 1 = $\frac{3}{4}\pi$

| Change in the phase of an RF pulse |
|---|
| - 0 - $\frac{3}{4}\pi$ - $\frac{6}{4}\pi$ - $\frac{9}{4}\pi$ - $\frac{12}{4}\pi$ - $\frac{15}{4}\pi$ - $\frac{18}{4}\pi$ - $\frac{21}{4}\pi$ - 0 - $\frac{3}{4}\pi$ - |

|  |  | Echo induced by water | Echo induced by fat |
|---|---|---|---|
| D_φ 1 |  | GRE, SE, Ew1 | GRE, Ef1, SE |
| Relative phase of a spine echo component | φ 1 - π - φ chem | -π / 4 | -3π / 4 |
| Relative chemical shift | φ chem | 0 | φ fat |

FIG. 18

$TR = 3.5 \times T\_out \quad m = 1, \phi\, fat = \frac{1}{2}\pi$ $\phi\, center = \phi\, fat = \frac{1}{2}\pi \quad \phi\, step = \frac{1}{4}\pi$ $\phi 2 = \frac{1}{4}\pi$

| Change in the phase of an RF pulse |
|---|
| $-0-\frac{1}{4}\pi-\frac{2}{4}\pi-\frac{3}{4}\pi-\frac{4}{4}\pi-\frac{5}{4}\pi-\frac{6}{4}\pi-\frac{7}{4}\pi-0-\frac{1}{4}\pi-$ |

|  |  | Echo induced by water | Echo induced by fat |
|---|---|---|---|
| $D\_\phi 2$ |  |  | 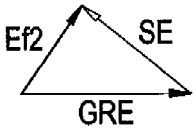 |
| Relative phase of a spine echo component | $\phi 2 - \pi - \phi\, chem$ | $-3\pi/4$ | $-5\pi/4$ |
| Relative chemical shift | $\phi\, chem$ | 0 | $\phi\, fat$ |

FIG. 19
| $\phi \text{ sum} = \phi \text{ step} = \frac{1}{4}\pi$ | Echo induced by water | Echo induced by fat |
|---|---|---|
| $\exp(i \times \phi \text{ sum}) \times D\_\phi 2$ | 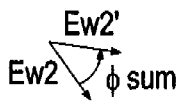 | 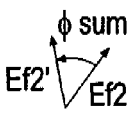 |
FIG. 20
| | Echo induced by water | Echo induced by fat |
|---|---|---|
| Dw<br>$D\_\phi 1 + \exp(i \times \phi \text{ sum}) \times D\_\phi 2$ | 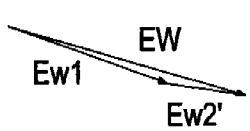 |  |
| Df<br>$D\_\phi 1 - \exp(i \times \phi \text{ sum}) \times D\_\phi 2$ | 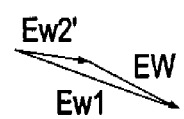 |  |

FIG. 21

$TR = 0.5 \times T\_out \quad m = 0, \phi \text{ fat} = \frac{3}{2}\pi$ $\phi \text{ center} = \pi + \frac{\phi \text{ fat}}{2} - \phi \text{ step} = \frac{5}{4}\pi \quad \phi \text{ step} = \frac{1}{2}\pi$ $\phi 1 = \frac{7}{4}\pi$

| Change in the phase of an RF pulse |
|---|
| $-0 - \frac{7}{4}\pi - \frac{14}{4}\pi - \frac{21}{4}\pi - \frac{28}{4}\pi - \frac{35}{4}\pi - \frac{42}{4}\pi - \frac{49}{4}\pi - 0 - \frac{7}{4}\pi -$ |

| | | Echo induced by water | Echo induced by fat |
|---|---|---|---|
| D_$\phi$1 | | Ew1 ◁ SE / GRE | GRE / Ef1 ▷ SE |
| Relative phase of a spine echo component | $\phi 1 - \pi - \phi$ chem | $3\pi/4$ | $-3\pi/4$ |
| Relative chemical shift | $\phi$ chem | 0 | $\phi$ fat |

FIG. 22

$TR = 0.5 \times T\_out \quad m = 0, \phi\, fat = \frac{3}{2}\pi$ $\phi\, center = \pi + \frac{\phi\, fat}{2} - \phi\, step = \frac{5}{4}\pi \quad \phi\, step = \frac{1}{2}\pi$ $\phi 2 = \frac{3}{4}\pi$

| Change in the phase of an RF pulse |
|---|
| $- 0 - \frac{3}{4}\pi - \frac{6}{4}\pi - \frac{9}{4}\pi - \frac{12}{4}\pi - \frac{15}{4}\pi - \frac{18}{4}\pi - \frac{21}{4}\pi - 0 - \frac{3}{4}\pi -$ |

|  |  | Echo induced by water | Echo induced by fat |
|---|---|---|---|
| D_$\phi 2$ |  | 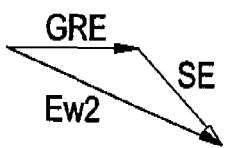 | 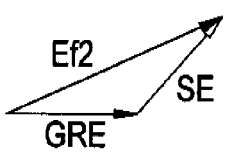 |
| Relative phase of a spine echo component | $\phi 2 - \pi - \phi\, chem$ | $-\pi/4$ | $-7\pi/4$ |
| Relative chemical shift | $\phi\, chem$ | 0 | $\phi\, fat$ |

FIG. 23
| $\phi\,sum = \phi\,step = \frac{1}{2}\pi$ | Echo induced by water | Echo induced by fat |
|---|---|---|
| $\exp(i \times \phi\,sum) \times D\_\phi 2$ | 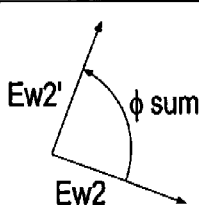 | 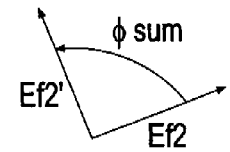 |
FIG. 24
| | Echo induced by water | Echo induced by fat |
|---|---|---|
| D w<br>$D\_\phi 1 + \exp(i \times \phi\,sum) \times D\_\phi 2$ | 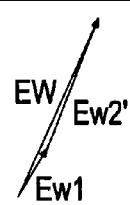 |  |
| D f<br>$D\_\phi 1 - \exp(i \times \phi\,sum) \times D\_\phi 2$ | 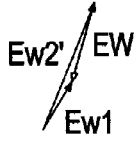 | 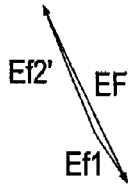 |

FIG. 25

$TR = 3.5 \times T\_out \quad m = 1, \phi\,fat = \frac{1}{2}\pi$ $\phi\,center = \pi \quad\quad \phi\,step = \frac{3}{4}\pi$ $\phi 1 = \frac{7}{4}\pi$

| Change in the phase of an RF pulse |
|---|
| $-0-\frac{7}{4}\pi-\frac{14}{4}\pi-\frac{21}{4}\pi-\frac{28}{4}\pi-\frac{35}{4}\pi-\frac{42}{4}\pi-\frac{49}{4}\pi-0-\frac{7}{4}\pi-$ |

| | Echo induced by water | Echo induced by fat |
|---|---|---|
| $D\_\phi 1$ | Ew1, SE, GRE (triangle) | Ef1, SE, GRE (triangle) |
| Relative phase of a spine echo component $\quad \phi 1 - \pi - \phi\,chem$ | $3\pi/4$ | $\pi/4$ |
| Relative chemical shift $\quad \phi\,chem$ | 0 | $\phi\,fat$ |

FIG. 26

$TR = 3.5 \times T\_out \quad m = 1, \phi\, fat = \frac{1}{2}\pi$ $\phi\, center = \pi \qquad \phi\, step = \frac{3}{4}\pi$ $\phi 2 = \frac{1}{4}\pi$

| Change in the phase of an RF pulse |
|---|
| $-0-\frac{1}{4}\pi-\frac{2}{4}\pi-\frac{3}{4}\pi-\frac{4}{4}\pi-\frac{5}{4}\pi-\frac{6}{4}\pi-\frac{7}{4}\pi-0-\frac{1}{4}\pi-$ |

| | | Echo induced by water | Echo induced by fat |
|---|---|---|---|
| $D\_\phi 2$ | | 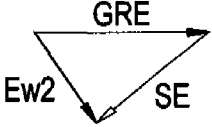 |  |
| Relative phase of a spine echo component | $\phi 2 - \pi - \phi\, chem$ | $-3\pi/4$ | $-5\pi/4$ |
| Relative chemical shift | $\phi\, chem$ | 0 | $\phi\, fat$ |

FIG. 27
| $\phi\ sum = \phi\ step = \frac{3}{4}\pi$ | Echo induced by water | Echo induced by fat |
|---|---|---|
| $\exp(i \times \phi\ sum) \times D\_\phi\ 2$ | 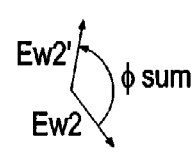 | 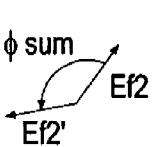 |
FIG. 28
| | Echo induced by water | Echo induced by fat |
|---|---|---|
| $D\_\phi\ 1 + \exp(i \times \phi\ sum) \times D\_\phi\ 2$ | 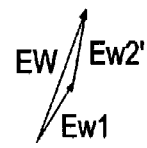 | 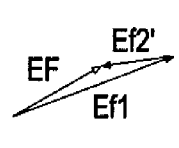 |
| $D\_\phi\ 1 - \exp(i \times \phi\ sum) \times D\_\phi\ 2$ |  | 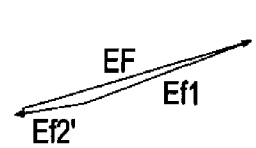 |

FIG. 31

TR = T_out $\phi 1 = \frac{3}{2}\pi$

| Change in the phase of an RF pulse |
|---|
| $-0 - \frac{3}{2}\pi - \frac{6}{2}\pi - \frac{9}{2}\pi - 0 - \frac{3}{2}\pi -$ |

| | | Echo induced by water | Echo induced by fat |
|---|---|---|---|
| D_$\phi$1<br><br>D_$3\pi/2$ | | Ew1 / SE / GRE | GRE / Ef1 / SE |
| Relative phase of a spine echo component | $\phi 1 - \pi - \phi$ chem | $\pi / 2$ | $-\pi / 2$ |
| Relative chemical shift | $\phi$ chem | 0 | $\pi$ |

FIG. 32

TR = T_out $\phi 2 = \frac{1}{2}\pi$

| Change in the phase of an RF pulse |
|---|
| $- 0 - \frac{1}{2}\pi - \frac{2}{2}\pi - \frac{3}{2}\pi - 0 - \frac{1}{2}\pi -$ |

|  |  | Echo induced by water | Echo induced by fat |
|---|---|---|---|
| D_$\phi 2$<br><br>D_$\pi/2$ |  | GRE, Ew2, SE (triangle) | Ef2, SE, GRE (triangle) |
| Relative phase of a spine echo component | $\phi 2 - \pi - \phi$ chem | $-\pi/2$ | $-3\pi/2$ |
| Relative chemical shift | $\phi$ chem | 0 | $\pi$ |

FIG. 33
| | Echo induced by water | Echo induced by fat |
|---|---|---|
| $\exp(i \times \frac{\pi}{2}) \times D\_\phi 2$ | 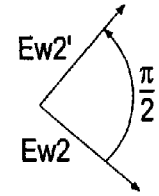 | 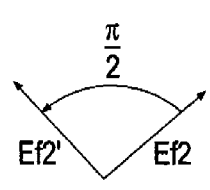 |
FIG. 34
| | Echo induced by water | Echo induced by fat |
|---|---|---|
| Dw<br>$D\_\phi 1 + \exp(i \times \phi \text{ sum}) \times D\_\phi 2$ | 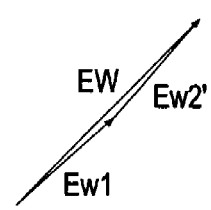 | 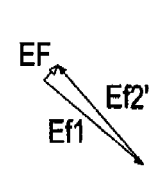 |
| Df<br>$D\_\phi 1 - \exp(i \times \phi \text{ sum}) \times D\_\phi 2$ | 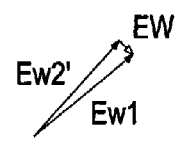 | 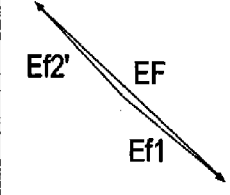 |

MR DATA ACQUISITION METHOD, MR IMAGE CONSTRUCTION METHOD, AND MRI SYSTEM

CROSS REFERENCE TO RELATED APPLICATIONS

This application is a divisional application of U.S. patent application Ser. No. 11/049,485 filed Feb. 1, 2005, now U.S. Pat. No. 7,365,537, which claims the benefit of Japanese Application No. 2004-040695 filed Feb. 18, 2004, both of which are hereby incorporated by reference in their entirety.

BACKGROUND OF THE INVENTION

The present invention relates to a magnetic resonance (MR) data acquisition method, an MR image construction method, and a magnetic resonance imaging (MRI) system. More particularly, the present invention is concerned with an MR data acquisition method capable of acquiring data, which is used to construct a water component-enhanced/fat component-suppressed image or a fat component-enhanced/water component-suppressed image, with a repetition time TR set to a desired value, an MR image construction method for constructing the water component-enhanced/fat component-suppressed image or fat component-enhanced/water component-suppressed image using the data acquired according to the MR data acquisition method, and an MRI system in which the methods are preferably implemented.

In the steady-state free precession (SSFP) method in which an NMR signal is induced by the steady-state free precession of the transverse magnetization of spins, the fast imaging employed steady-state acquisition (FIESTA) method, or the fast imaging with steady-state free precession (True FISP) method, the fat saturation RF pulse method, the fluctuation equilibrium MR (FEMR) method, or the linear combination SSFP (LCSSFP) method is used in combination in order to construct a water component-enhanced image or a fat component-enhanced image.

According to the LCSSFP method, a repetition time TR is set to an out-of-phase time T_out during which spins in water and spins in fat are out of phase with each other due to chemical shifts. Data $D\_\phi1$ is acquired according to a steady-state pulse sequence (FIG. 29) stipulating that when $\phi1=3\pi/2$ is established, the phase of an RF pulse is varied in order of $0\times\phi1$, $1\times\phi1$, $2\times\phi1$, $3\times\phi1$, etc. Data $D\_\phi2$ is acquired according to a steady-state pulse sequence (FIG. 30) stipulating that when $\phi2=\pi/2$ is established, the phase of an RF pulse is varied in order of $0\times\phi2$, $1\times\phi2$, $2\times\phi2$, $3\times\phi2$, etc. Data processing expressed as $D\_\phi1+\exp(i\times\pi/2)\times D\_\phi2$ is performed in order to produce data Dw. The data Dw is used to construct a water component-enhanced/fat component-suppressed image Gw. Moreover, data processing expressed as $D\_\phi1-\exp(i\times\pi/2)\times D\_\phi2$ is performed in order to produce data Df. The data Df is used to construct a fat component-enhanced/water component-suppressed image Gf (refer to, for example, Non-patent Document 1 or Patent Document 1).

[Non-patent Document 1] "Linear Combination Steady-state Free Precession MRI" written by Vasanawala et al. (Magnetic Resonance in Medicine, Vol. 43, 2000, pp. 82-90)

[Patent Document 1] Japanese Unexamined Patent Application Publication No. 2003-52667 ([0009] and [0010])

According to the LCSSFP method, the repetition time TR must be set to the out-of-phase time T_out. The out-of-phase time T_out depends on a magnetic field system. For example, when the magnetic field system offers a magnetic field strength of 0.2 T, the out-of-phase time is 20 ms. When the magnetic field strength is 0.35 T, the out-of-phase time is 10 ms. When the magnetic field strength is 0.7 T, the out-of-phase time is 5 ms. When the magnetic field strength is 1.5 T, the out-of-phase time is 2.3 ms.

However, for example, when the magnetic field system offers a magnetic field strength of 0.2 T, if the repetition time TR is set to 20 ms, it poses a problem in that a scan time gets long. On the other hand, for example, when the magnetic field system offers a magnetic field strength of 1.5 T, if the repetition time TR is set to 2.3 ms, hardware must incur a large load. Namely, the conventional LCSSFP method stipulates that the repetition time TR is set to the out-of-phase time T_out. The conventional LCSSFP method is therefore hardly implemented in a low-field strength system or a high-field strength system.

SUMMARY OF THE INVENTION

Therefore, an object of the present invention is to provide an MR data acquisition method capable of acquiring data, which is used to construct a water component-enhanced/fat component-suppressed image or a fat component-enhanced/water component-suppressed image, with a repetition time TR set to a desired value, an MR image construction method for constructing the water component-enhanced/fat component-suppressed image or fat component-enhanced/water component-suppressed image using the data acquired in the MR data acquisition method, and an MRI system in which the methods can be preferably implemented.

The method proposed in Patent Document 1 requires acquisition of data not only by varying the phase of an RF pulse in the same way as that in the LCSSFP method but also by varying the echo time TE ([0073] and [0074] in Patent Document 1).

In contrast, according to the present invention, the echo time TE need not be varied.

According to the first aspect of the present invention, there is provided an MR data acquisition method for acquiring data $D\_\phi fat$ according to a steady-state pulse sequence specifying that the phase of an RF pulse is varied in order of 0, $1\times\phi fat$, $2\times\phi fat$, etc. Herein, $\phi fat=(2-TR/T\_out+2\times m)\times\pi$ is established on the assumption that m denotes an integer equal to or larger than 0 and meets $TR/(2\times T\_out)-1<m<TR/(2\times T\_out)$ where TR denotes a repetition time and T_out denotes the time during which spins in water and spins in fat are out of phase with each other due to chemical shifts.

In the MR data acquisition method according to the first aspect, the data $D\_\phi fat$ to be used to construct a water component-enhanced/fat component-suppressed image Gw can be acquired with the repetition time TR set to a desired value.

According to the second aspect of the present invention, there is provided an MR data acquisition method for acquiring data $D\_\phi1$ according to a steady-state pulse sequence specifying that the phase of an RF pulse is varied in order of 0, $1\times\phi1$, $2\times\phi1$, etc., and acquiring data $D\_\phi2$ according to a steady-state pulse sequence specifying that the phase of an RF pulse is varied in order of 0, $1\times\phi2$, $2\times\phi2$, etc. Herein, $\phi1=\phi center+\phi step$ and $\phi2=\phi center-\phi step$ are established on the assumption that $\phi center$ denotes a center phase, that is, a phase difference associated with the center of the portion of a line graph indicating a decrease in a signal strength, and that a phase width, that is, the width of the portion of the line graph indicating the decrease in a signal strength is $2\times\phi step$ (where any of $0<\phi center<\pi$, $-\pi<\phi center<0$, $0<\phi step<\pi/2$, and $\pi/2<\phi step<\pi$ is met).

In the MR data acquisition method according to the second aspect, the data $D\_\phi1$ and data $D\_\phi2$ to be used to construct a water component-enhanced/fat component-suppressed image Gw or a fat component-enhanced/water component-suppressed image Gf can be acquired with the repetition time TR set to a desired value.

Incidentally, $\phi$center and $\phi$step are experimentally set to practically optimal values with various theoretical optical values taken into consideration as indices.

According to the third aspect of the present invention, there is provided an MR data acquisition method, wherein: when $\phi$fat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, $\phi$center=$\phi$fat is established under the condition of 0<$\phi$step≦π/2−|π−$\phi$fat|/2.

In the MR data acquisition method according to the third aspect, data D_$\phi$1 and data D_$\phi$2 to be used to construct a water component-enhanced/fat component-suppressed image Gw or a fat component-enhanced/water component-suppressed image Gf can be acquired with the repetition time TR set to a desired value.

According to the fourth aspect of the present invention, there is provided an MR data acquisition method, wherein: when $\phi$fat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, $\phi$center=$\phi$fat/2+$\phi$step is established under the condition of $\phi$fat/2≦$\phi$step≦π−$\phi$fat/2 as long as $\phi$fat≦π is met, or $\phi$center=π+$\phi$fat/2−$\phi$step is established under the condition of π−$\phi$fat/2≦$\phi$step≦$\phi$fat/2 as long as $\phi$fat≧π is met.

In the MR data acquisition method according to the fourth aspect, data D_$\phi$1 and data D_$\phi$2 to be used to construct a water component-enhanced/fat component-suppressed image Gw or a fat component-enhanced/water component-suppressed image Gf can be acquired with the repetition time TR set to a desired value.

According to the fifth aspect of the present invention, there is provided an MR data acquisition method, wherein: when $\phi$fat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, $\phi$center=π is established under the condition of π/2+|π−$\phi$fat|/2≦$\phi$step<π.

In the MR data acquisition method according to the fifth aspect, data D_$\phi$1 and data D_$\phi$2 to be used to construct a water component-enhanced/fat component-suppressed image Gw or a fat component-enhanced/water component-suppressed image Gf can be acquired with the repetition time TR set to a desired value.

According to the sixth aspect of the present invention, there is provided an MR data acquisition method in which $\phi$step=π/2−|π−$\phi$fat|/2 is established.

According to the seventh aspect of the present invention, there is provided an MR data acquisition method in which $\phi$step=π/2 and $\phi$center=$\phi$fat/2+π/2 are established.

According to the eighth aspect of the present invention, there is provided an MR data acquisition method in which $\phi$step=π/2+|π−$\phi$fat|/2 is established.

According to the ninth aspect of the present invention, there is provided an MR image construction method for constructing an MR image Gw using data D_fat acquired according to the foregoing MR data acquisition method.

In the MR image construction method according to the ninth aspect, the water component-enhanced/fat component-suppressed image Gw can be constructed.

According to the tenth aspect of the present invention, there is provided an MR image construction method for constructing an MR image Gw using data Dw. Herein, when data D_$\phi$1 and data D_$\phi$2 that are acquired according to the foregoing MR data acquisition method are synthesized with a phase value added to the data D_$\phi$2 using $\phi$sum defined as 0<$\phi$sum<π, the data Dw is produced according to Dw=D_$\phi$1+ exp(i×$\phi$sum)×D_$\phi$2.

In the MR image construction method according to the tenth aspect, the water component-enhanced/fat component-suppressed image Gw can be constructed.

Incidentally, $\phi$sum is experimentally set to a practically optimal value with theoretical optimal values taken into consideration as indices.

According to the eleventh aspect of the present invention, there is provided an MR image construction method in which $\phi$sum=$\phi$step is established.

According to the twelfth aspect of the present invention, there is provided an MR image construction method for constructing an MR image Gf using data Df. Herein, when data D_$\phi$1 and data D_$\phi$2 that are acquired according to the aforesaid MR data acquisition method are synthesized with a phase value added to the data D_$\phi$2 using $\phi$sum defined as 0<$\phi$sum<π, the data Df is produced according to Df=D_$\phi$1− exp(i×$\phi$sum)×D_$\phi$2.

In the MR image construction method according to the twelfth aspect, the fat component-enhanced/water component-suppressed image Gf can be constructed.

According to the thirteenth aspect of the present invention, there is provided an MR image construction method in which $\phi$sum=$\phi$step is established.

According to the fourteenth aspect of the present invention, there is provided an MR image construction method in which a water component is enhanced.

According to the fifteenth aspect of the present invention, there is provided an MR image construction method in which a fat component is suppressed.

According to the sixteenth aspect of the present invention, there is provided an MR image construction method in which a fat component is enhanced.

According to the seventeenth aspect of the present invention, there is provided an MR image construction method in which a water component is suppressed.

According to the eighteenth aspect of the present invention, there is provided an MRI system comprising a data acquisition means that acquires data D_$\phi$fat according to a steady-state pulse sequence specifying that the phase of an RF pulse is varied in order of 0, 1×$\phi$fat, 2×$\phi$fat, etc. Herein, $\phi$fat=(2− TR/T_out+2×m)×π is established on the assumption that m denotes an integer equal to or larger than 0 and meets TR/(2× T_out)−1<m<TR/(2×T_out) where TR denotes a repetition time and T_out denotes the time during which spins in water and spins in fat are out of phase with each other due to chemical shifts.

In the MRI system according to the eighteenth aspect, data D_$\phi$fat to be used to construct a water component-enhanced/ fat component-suppressed image Gw can be acquired with the repetition time TR set to a desired value.

According to the nineteenth aspect of the present invention, there is provided an MRI system comprising a data acquisition means that acquires data D_$\phi$1 according to a steady-state pulse sequence specifying that the phase of an RF pulse is varied in order of 0, 1×$\phi$1, 2×$\phi$1, etc. and that acquires data D_$\phi$2 according to a steady-state pulse sequence specifying that the phase of an RF pulse is varied in order of 0, 1×$\phi$2, 2×$\phi$2, etc. Herein, $\phi$1=$\phi$center+$\phi$step and $\phi$2=$\phi$center−$\phi$step are established on the assumption that $\phi$center denotes a center phase, that is, a phase difference associated with the center of the portion of a line graph indicating a decrease in a signal strength and that a phase width, that is, the width of the portion of the line graph indicating the decrease therein is defined as 2×$\phi$step (where any of 0<$\phi$center<$\pi$, −$\pi$<$\phi$center<0, 0<$\phi$step<$\pi$/2, and $\pi$/2<$\phi$step<$\pi$ is met).

In the MRI system according to the nineteenth aspect, data D_$\phi$1 and data D_$\phi$2 to be used to construct a water component-enhanced/fat component-suppressed image Gw or a fat component-enhanced/water component-suppressed image Gf can be acquired with the repetition time TR set to a desired value.

According to the twentieth aspect of the present invention, there is provided an MRI system, wherein when $\phi$fat=(2−TR/T_out+2×m)×$\pi$ is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, $\phi$center=$\phi$step is established under the condition of 0<$\phi$step<$\pi$/2−|$\pi$−$\phi$fat|/2.

In the MRI system according to the twentieth aspect, data D_$\phi$1 and data D_$\phi$2 to be used to construct a water component-enhanced/fat component-suppressed image Gw or a fat component-enhanced/water component-suppressed image Gf can be acquired with the repetition time TR set to a desired value.

According to the twenty-first aspect of the present invention, there is provided an MRI system wherein when $\phi$fat=(2−TR/T_out+2×m)×$\pi$ is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, $\phi$center=$\phi$fat/2+$\phi$step is established under the condition of $\phi$fat/2≦$\phi$step≦$\pi$−$\phi$fat/2 as long as $\phi$fat≦$\pi$ is met, or $\phi$center=$\pi$+$\phi$fat/2−$\phi$step is established under the condition of $\pi$−$\phi$fat/2≦$\phi$step≦$\phi$fat/2 as long as $\phi$fat≧$\pi$ is met.

In the MRI system according to the twenty-first aspect, data D_$\phi$1 and data D_$\phi$2 to be used to construct a water component-enhanced/fat component-suppressed image Gw or a fat component-enhanced/water component-suppressed image Gf can be acquired with the repetition time TR set to a desired value.

According to the twenty-second aspect of the present invention, there is provided an MRI system, wherein when $\phi$fat=(2−TR/T_out+2×m)×$\pi$ is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, $\phi$center=$\pi$ is established under the condition of $\pi$/2+|$\pi$−$\phi$fat|/2≦$\phi$step<$\pi$.

In the MRI system according to the twenty-second aspect, data D_$\phi$1 and data D_$\phi$2 to be used to construct a water component-enhanced/fat component-suppressed image Gw or a fat component-enhanced/water component-suppressed image Gf can be acquired with the repetition time TR set to a desired value.

According to the twenty-third aspect of the present invention, there is provided an MRI system in which $\phi$step=$\pi$/2−|$\pi$−$\phi$fat|/2 is established.

According to the twenty-fourth aspect of the present invention, there is provided an MRI system in which $\phi$step=$\pi$/2 and $\phi$center=$\phi$fat/2+$\pi$/2 are established.

According to the twenty-fifth aspect of the present invention, there is provided an MRI system in which $\phi$step=$\pi$/2+|$\pi$−$\phi$fat|/2 is established.

According to the twenty-sixth aspect of the present invention, there is provided an MRI system in which the MRI system comprises an image construction means for constructing an MR image Gw using the data D_fat.

In an MR image construction method employed in the twenty-sixth aspect, the water component-enhanced/fat component-suppressed image Gw can be constructed.

According to the twenty-seventh aspect of the present invention, there is provided an MRI system in which the MRI system comprises an image construction means for constructing an MR image Gw using data Dw. Herein, when the data D_$\phi$1 and data D_$\phi$2 are synthesized with a phase value added to the data D_$\phi$2 using $\phi$sum defined as 0<$\phi$sum<$\pi$, the data Dw is produced according to Dw=D_$\phi$1+exp(i×$\phi$sum)×D_$\phi$2.

In an MR construction method employed in the twenty-seventh aspect, the water component-enhanced/fat component-suppressed image Gw can be constructed.

According to the twenty-eighth aspect of the present invention, there is provided an MRI system in which $\phi$sum=$\phi$step is established.

According to the twenty-ninth aspect of the present invention, there is provided an MRI system in which the MRI system comprises an image construction means for constructing an MR image Gf using data Df. Herein, when the data D_$\phi$1 and data D_$\phi$2 are synthesized with a phase value added to the data D_$\phi$2 using $\phi$sum defined as 0<$\phi$sum<$\pi$, the data Df is produced according to Df=D_$\phi$1−exp(i×$\phi$sum)×D_$\phi$2.

In an MR construction method employed in the twenty-ninth aspect, the fat component-enhanced/water component-suppressed image Gf can be constructed.

According to the thirtieth aspect of the present invention, there is provided an MRI system in which $\phi$sum=$\phi$step is established.

According to the thirty-first aspect of the present invention, there is provided an MRI system in which a water component is enhanced.

According to the thirty-second aspect of the present invention, there is provided an MRI system in which a fat component is suppressed.

According to the thirty-third aspect of the present invention, there is provided an MRI system in which a fat component is enhanced.

According to the thirty-fourth aspect of the present invention, there is provided an MRI system in which a water component is suppressed.

According to an MR data acquisition method of the present invention, data to be used to construct a water component-enhanced/fat component-suppressed image or a fat component-enhanced/water component-suppressed image can be acquired with the repetition time TR set to a desired value.

According to an MR image construction method of the present invention, the water component-enhanced/fat component-suppressed image or fat component-enhanced/water component-suppressed image can be constructed using the data acquired according to the MR data acquisition method in accordance with the present invention.

According to an MRI system of the present invention, the data to be used to construct the water component-enhanced/fat component-suppressed image or fat component-enhanced/water component-suppressed image can be acquired with the repetition time TR set to a desired value. Moreover, the water component-enhanced/fat component-suppressed image or fat component-enhanced/water component-suppressed image can be constructed.

An MR data acquisition method, an MR image construction method, and an MRI system in accordance with the present invention can be utilized for construction of a water component-enhanced/fat component-suppressed image or a fat component-enhanced/water component-suppressed image.

Further objects and advantages of the present invention will be apparent from the following description of the preferred embodiments of the invention as illustrated in the accompanying drawings.

BRIEF DESCRIPTION OF THE DRAWINGS

FIG. 5 is a flowchart describing image construction employed in the first embodiment.

FIG. 6 is an explanatory diagram conceptually expressing the principles of the first embodiment.

FIG. 7 is an explanatory diagram conceptually expressing the principles of the second embodiment.

FIG. 13 is a conceptual explanatory diagram showing the nature of data acquired according to the first steady-state pulse sequence employed in the third embodiment.

FIG. 14 is a conceptual explanatory diagram showing the nature of data acquired according to the second steady-state pulse sequence employed in the third embodiment.

FIG. 15 is a conceptual explanatory diagram showing rotation of the phases of echoes represented by the data acquired according to the second steady-state pulse sequence employed in the third embodiment.

FIG. 16 is an explanatory diagram conceptually showing the principles of the third embodiment.

FIG. 17 is a conceptual explanatory diagram showing the nature of data acquired according to a first steady-state pulse sequence employed in the fourth embodiment.

FIG. 18 is a conceptual explanatory diagram showing the nature of data acquired according to a second steady-state pulse sequence employed in the fourth embodiment.

FIG. 19 is a conceptual explanatory diagram showing rotation of the phases of echoes represented by the data acquired according to the second steady-state pulse sequence employed in the fourth embodiment.

FIG. 20 is an explanatory diagram conceptually showing the principles of the fourth embodiment.

FIG. 21 is a conceptual explanatory diagram showing the nature of data acquired according to a first steady-state pulse sequence employed in the fifth embodiment.

FIG. 22 is a conceptual explanatory diagram showing the nature of data acquired according to a second steady-state pulse sequence employed in the fifth embodiment.

FIG. 23 is a conceptual explanatory diagram showing rotation of the phases of echoes represented by the data acquired according to the second steady-state pulse sequence employed in the fifth embodiment.

FIG. 24 is an explanatory diagram conceptually showing the principles of the fifth embodiment.

FIG. 25 is a conceptual explanatory diagram showing the nature of data acquired according to a first steady-state pulse sequence employed in the sixth embodiment.

FIG. 26 is a conceptual explanatory diagram showing the nature of data acquired according to a second steady-state pulse sequence employed in the sixth embodiment.

FIG. 27 is a conceptual explanatory diagram showing rotation of the phases of echoes represented by the data acquired according to the second steady-state pulse sequence employed in the sixth embodiment.

FIG. 28 is an explanatory diagram conceptually showing the principles of the sixth embodiment.

FIG. 31 is a conceptual explanatory diagram showing the nature of data acquired according to the first steady-state pulse sequence employed in the related art.

FIG. 32 is a conceptual explanatory diagram showing the nature of data acquired according to the second steady-state pulse sequence employed in the related art.

FIG. 33 is a conceptual explanatory diagram showing rotation of the phases of echoes represented by the data acquired according to the second steady-state pulse sequence employed in the related art.

FIG. 34 is an explanatory diagram conceptually showing the principles of the related art.

DETAILED DESCRIPTION OF THE INVENTION

The present invention will be further described below by taking illustrated embodiments for instance. Noted is that the present invention will not be limited to the embodiments.

Prior to description of embodiments, a conceptual model will be presented for explanation of the principles of the present invention.

Data $D\_\phi$ acquired according to a steady-state pulse sequence specifying that the phase of an RF pulse is varied in order of $0\times\phi$, $1\times\phi$, $2\times\phi$, $3\times\phi$, etc. originates from an echo Ew induced by water and an echo Ef induced by fat. The echo Ew induced by water is a synthesis of a gradient echo GRE and a spin echo SE which are induced by water. The gradient echo component leads the spin echo component by $\phi-\pi$. On the other hand, the echo Ef induced by fat is a synthesis of a gradient echo and a spin echo which are induced by fat. The gradient echo component leads the spin echo component by $\phi-\pi\phi$fat. Herein, $\phi$fat denotes a phase by which the spin echo component of an echo induced by water leads the spin echo component of an echo induced by water in a steady state due to chemical shifts. For generalization, the spin echo component shall lead the gradient echo component by φ−π−φchem irrespective of whether they are the components of an echo induced by water or fat. For the spin echo component of an echo induced by water, φchem shall be equal to 0. For the spin echo component of an echo induced by fat, φchem shall be equal to φfat.

Figure 29:
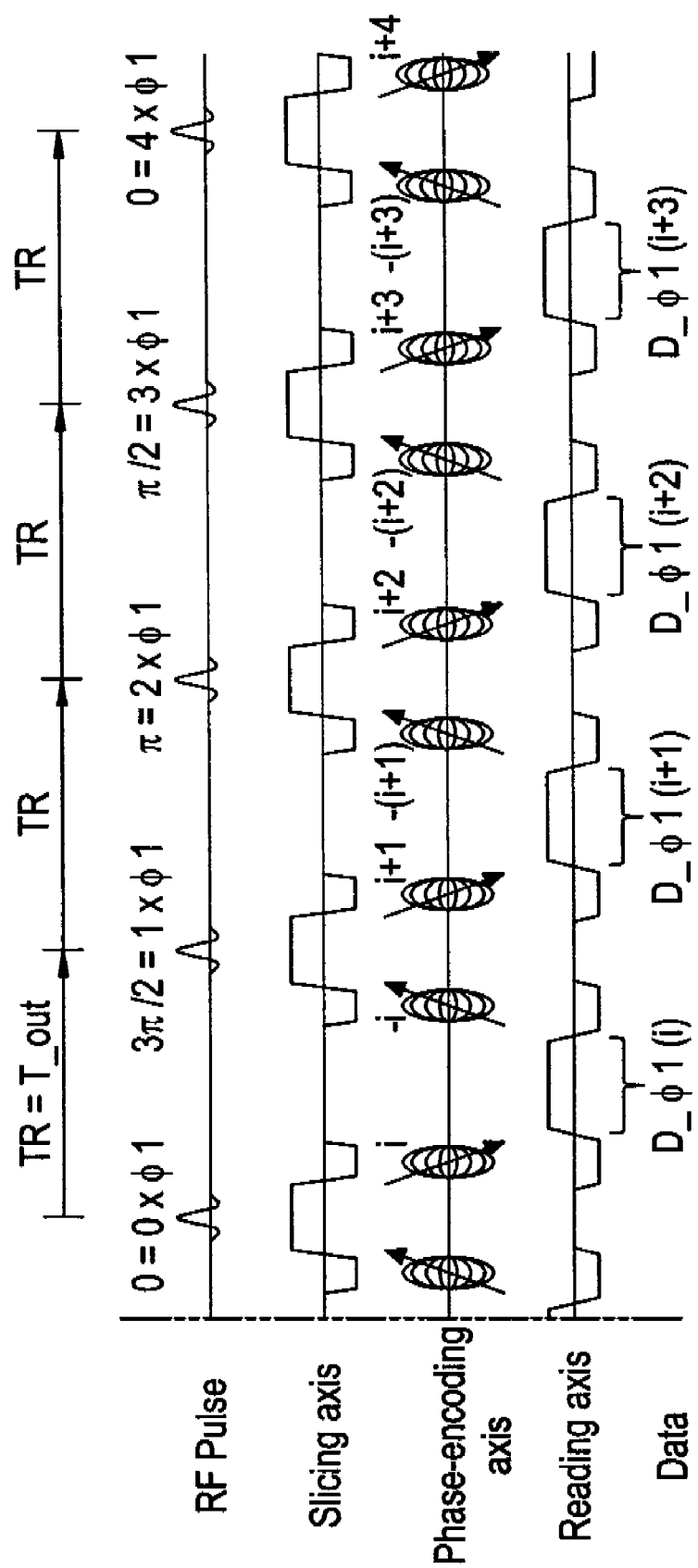
FIG. 29 is an explanatory diagram showing a first steady-state pulse sequence employed in a related art.

The foregoing conceptual model is adapted to data D_1 acquired according to a steady-state pulse sequence specifying φ1=3π/2 as shown in FIG. 29. In this case, as shown in FIG. 31, the spin echo component of an echo Ew1 induced by water leads the gradient echo component thereof by π/2. As for an echo Ef1 induced by fat, the spin echo component of the echo leads the gradient echo component thereof by −π/2.

Figure 30:
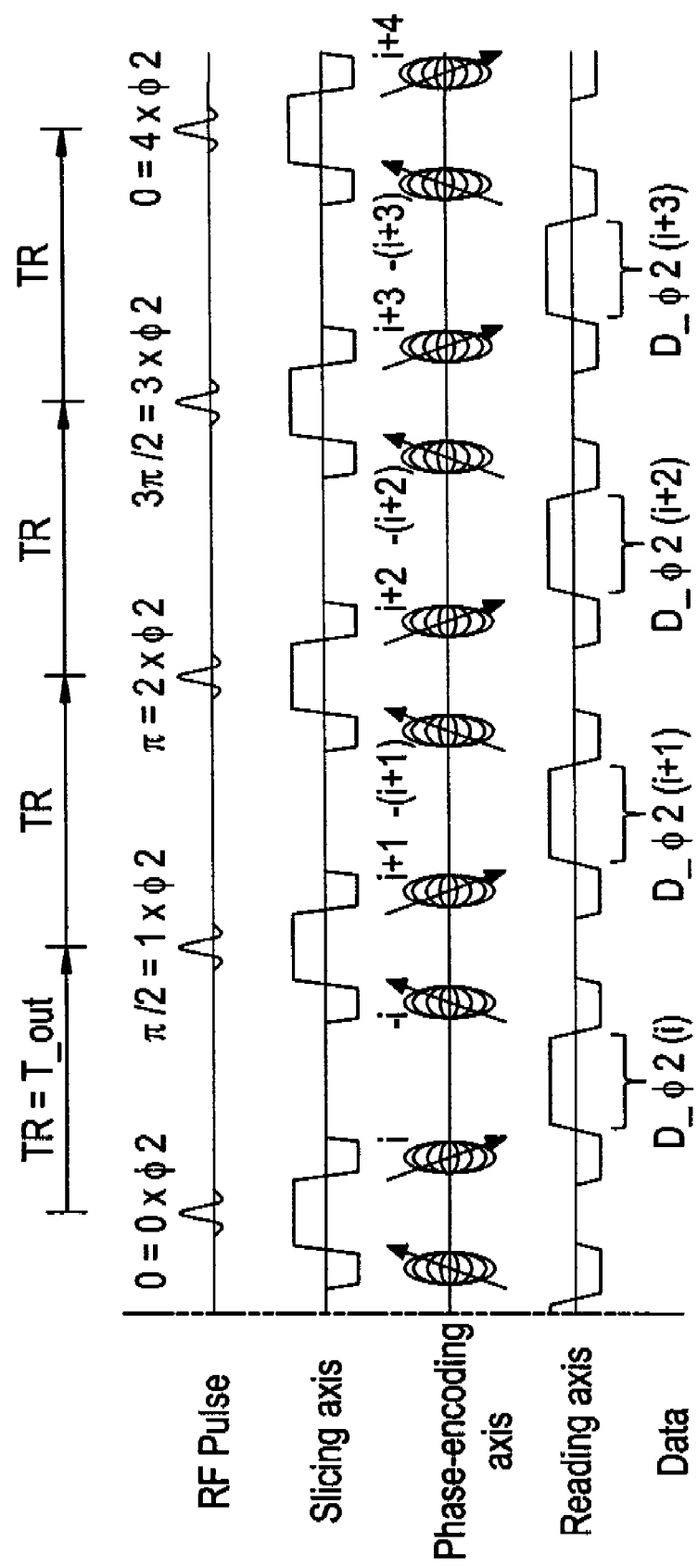
FIG. 30 is an explanatory diagram showing a second steady-state pulse sequence employed in the related art.

Moreover, the foregoing conceptual model is adapted to data D_φ2 acquired according to a steady-state pulse sequence specifying φ2=π/2 as shown in FIG. 30. In this case, as shown in FIG. 32, the spin echo component of an echo Ew2 induced by water leads the gradient echo thereof by −π/2. As for an echo Ef2 induced by fat, the spin echo component of the echo leads the gradient echo component thereof by −3π/2.

As shown in FIG. 33, exp(i×π/2)×D_φ2 signifies that the echo Ew2 induced by water is rotated by π/2 in order to produce an echo Ew2' and that the echo Ef2 induced by fat is rotated by π/2 in order to produce an echo Ef2'.

Consequently, as shown in FIG. 34, data processing expressed as Dw=D_φ1+exp(i×π/2)×D_φ2 signifies that the echo Ew1 induced by water and the echo Ew2' are added up and the echo Ef1 induced by fat and the echo Ef2' are added up. Eventually, after the addition is completed, the resultant echo Ew induced by water is enhanced and the resultant echo Ef induced by fat is suppressed.

On the other hand, as shown in FIG. 34, data processing expressed as Df=D_φ1−exp(i×π/2)×D_φ2 signifies that the echo Ew2' is subtracted from the echo Ew1 induced by water and the echo Ef2' is subtracted from the echo Ef1 induced by fat. Eventually, after the subtraction is completed, the resultant echo Ew induced by water is suppressed and the resultant echo Ef induced by fat is enhanced.

As mentioned above, according to the LCSSFP method, a water component-enhanced/fat component-suppressed image Gw can be constructed using data Dw and a fat component-enhanced/water component-suppressed image Gf can be constructed using data Df.

Figure 35:
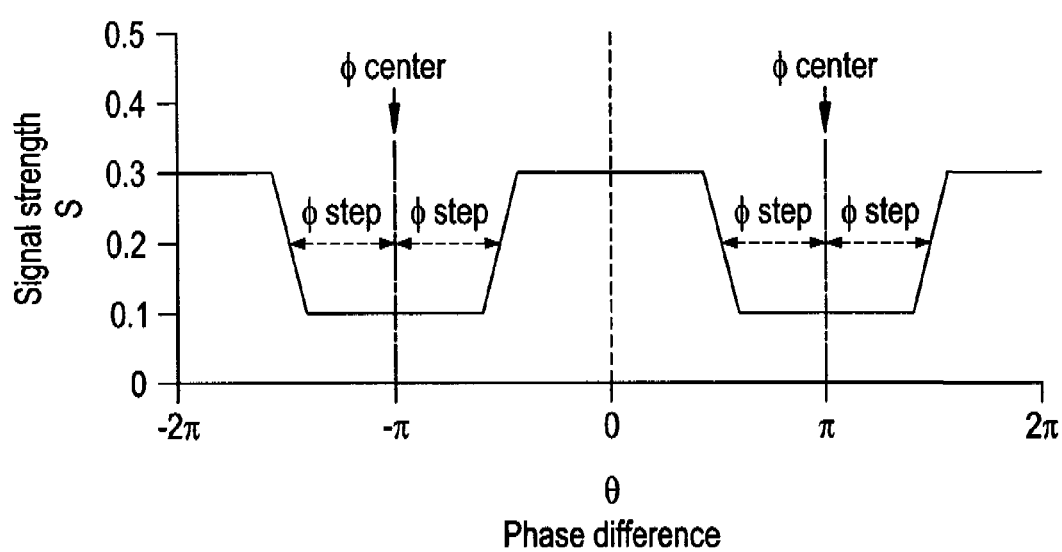
FIG. 35 is an explanatory diagram expressing $\phi$center and $\phi$step employed in the related art.

Incidentally, FIG. 35 shows a change in a signal strength S in association with a change in a phase difference θ by which the spin echo component of an echo induced by fat leads the spin echo component of an echo induced by water.

The phase difference associated with the center of the portion of a line graph indicating a decrease in the signal strength S shall be defined as a center phase φcenter, and the center phase φcenter is set to π. The width of the portion of the line graph indicating the decrease therein shall be defined as a phase width φstep, and the half of the phase width φstep is set to π/2. The relationships of φcenter=(φ1+φ2)/2 and φstep=(φ1−φ2)/2 are established.

FIRST EMBODIMENT

Figure 1:
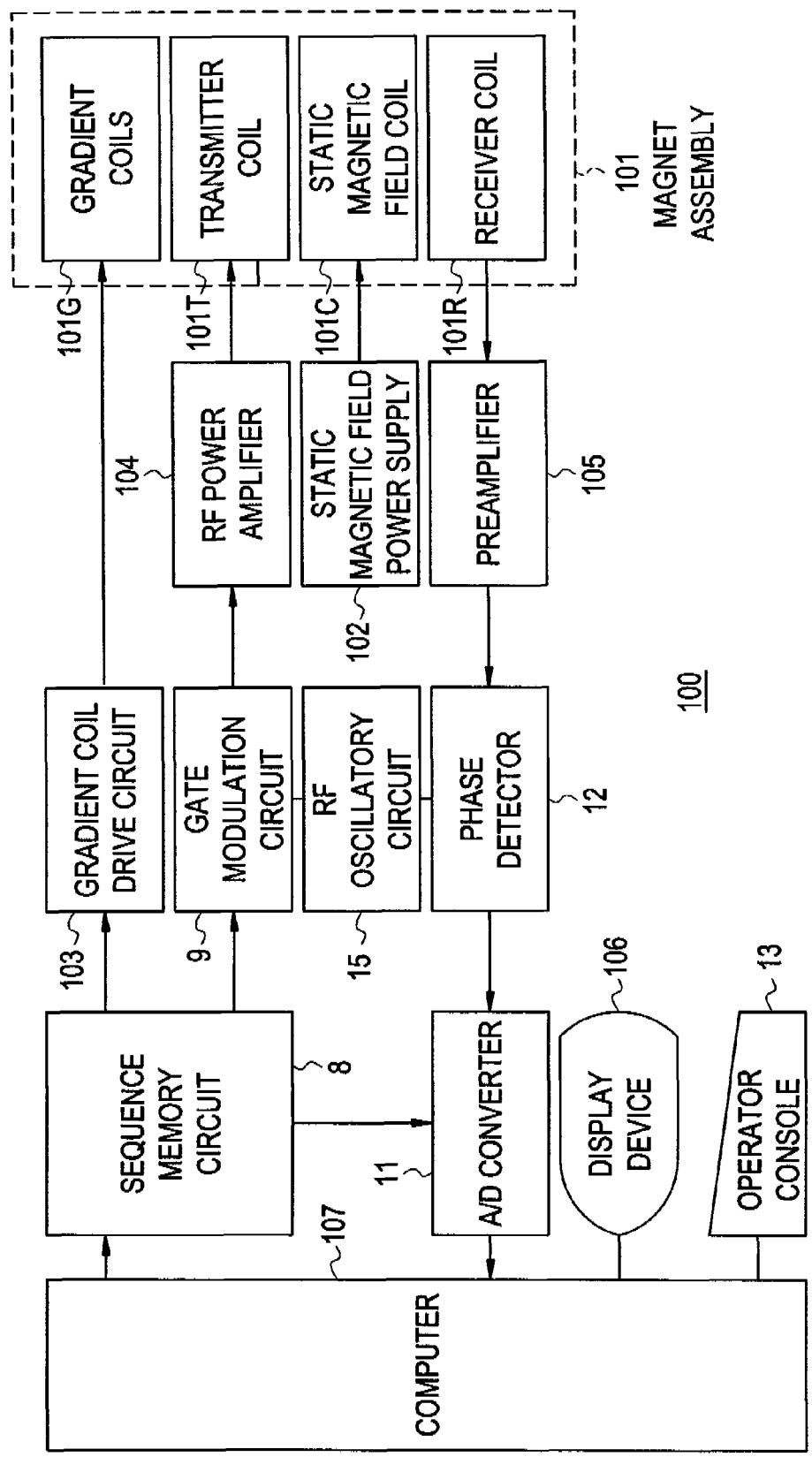
FIG. 1 is a block diagram showing the configuration of an MRI system in accordance with the first embodiment.

FIG. 1 is a block diagram showing an MRI system 100 in accordance with the first embodiment.

In the MRI system 100, a magnet assembly 101 has a bore into which a subject is inserted. A static magnetic field coil 101C for applying a constant static magnetic field to the subject, gradient coils 101G for producing magnetic field gradients whose directions coincide with the directions of X, Y, and Z axes (that serve as a slicing axis, a phase-encoding axis, and a reading axis), a transmitter coil 101T for applying RF pulses for excitation of spins of nuclei in the subject's body, and a receiver coil 101R for detecting NMR signals induced by the subject. The static magnetic field coil 101C, gradient coils 101G, transmitter coil 101T, and receiver coil 101R are connected to a static magnetic field power supply 102, a gradient coil drive circuit 103, an RF power amplifier 104, and a preamplifier 105 respectively.

Incidentally, a permanent magnet may be substituted for the static magnetic field coil 101C.

A sequence memory circuit 8 activates the gradient coil drive circuit 103 according to a stored pulse sequence in response to a command issued from a computer 107. This causes the gradient coils 101G included in the magnet assembly 101 to produce magnetic field gradients. Moreover, the sequence memory circuit 8 activates a gate modulation circuit 9 for modulation of a carrier-wave output signal of an RF oscillatory circuit 15 into a pulsating signal that exhibits a predetermined timing, a predetermined envelope, and a predetermined phase. The pulsating signal is applied as RF pulses to the RF power amplifier 104. After the power of the RF pulses is amplified by the RF power amplifier 104, the RF pulses are applied to the transmitter coil 101T included in the magnet assembly 101.

The preamplifier 105 amplifies NMR signals received from the subject by the receiver coil 101R included in the magnet assembly 101, and transfers the resultant NMR signals to a phase detector 12. The phase detector 12 detects the phases of the NMR signals sent from the preamplifier 105 using the carrier-wave output signal of the RF oscillatory circuit 15 as a reference signal, and transfers the signals to an A/D converter 11. The A/D converter 11 converts the signals, which have the phases thereof detected, from an analog form to a digital form, and transfers the resultant signals to the computer 107.

The computer 107 is responsible for overall control and receives information entered at an operator console 13. Moreover, the computer 107 reads digital data from the A/D converter 11, and performs computation on the digital data to construct an image.

An image and a message are displayed on a display device 106.

Figure 2:
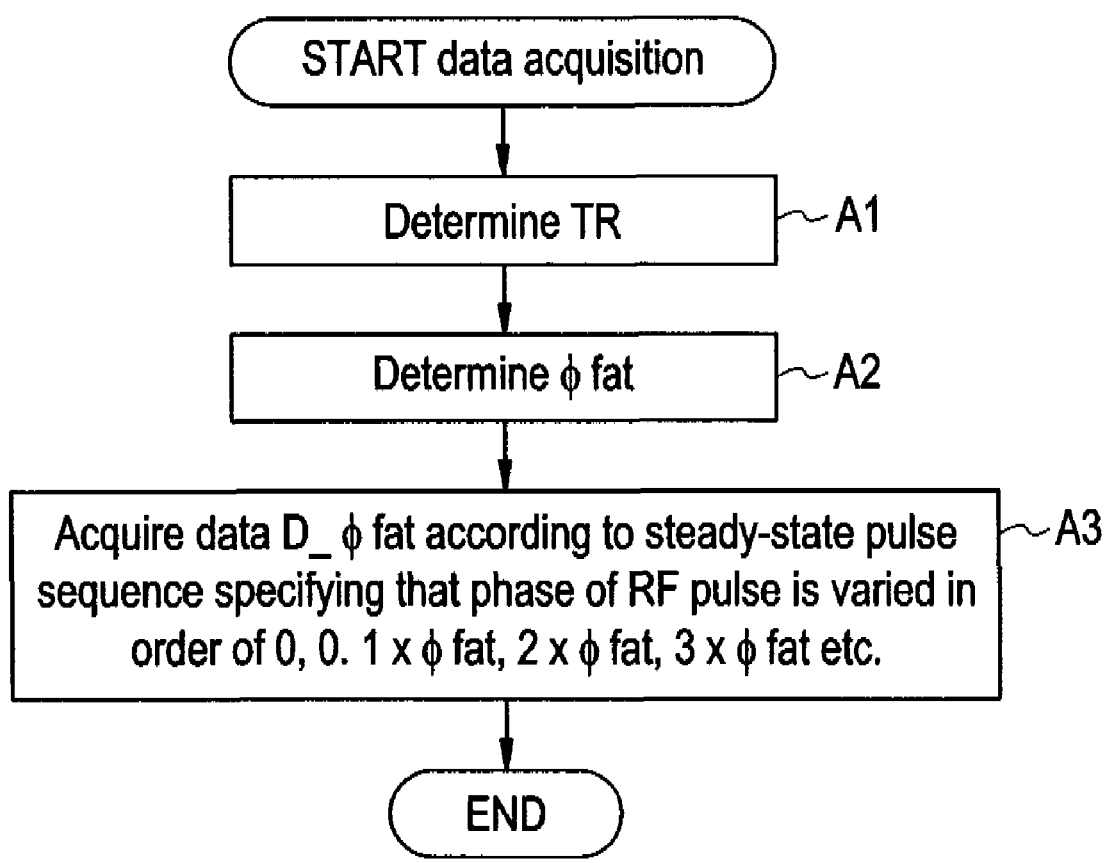
FIG. 2 is a flowchart describing data acquisition employed in the first embodiment.

FIG. 2 is a flowchart describing data acquisition employed in the first embodiment.

At step A1, the computer 107 determines a repetition time TR. For example, the options for the repetition time TR are displayed on the display device 106, and an operator is prompted to select any of the options. Herein, a magnetic field system shall offer a magnetic field strength of 0.2 T and the repetition time TR shall be set to 10 ms.

At step A2, φfat is determined according to φfat=(2−TR/T_out+2×m)×π where m denotes an integer equal to or larger than 0 and meets TR/(2×T_out)−1<m<TR/(2×T_out). Herein, T_out denotes the time during which spins in water and spins in fat are out of phase with each other due to chemical shifts.

When the magnetic field system offers a magnetic field strength of 0.2 T, T_out is 20 ms. Therefore, if the repetition time TR is 10 ms, m equals 0 and φfat equals 3π/2.

Figure 3:
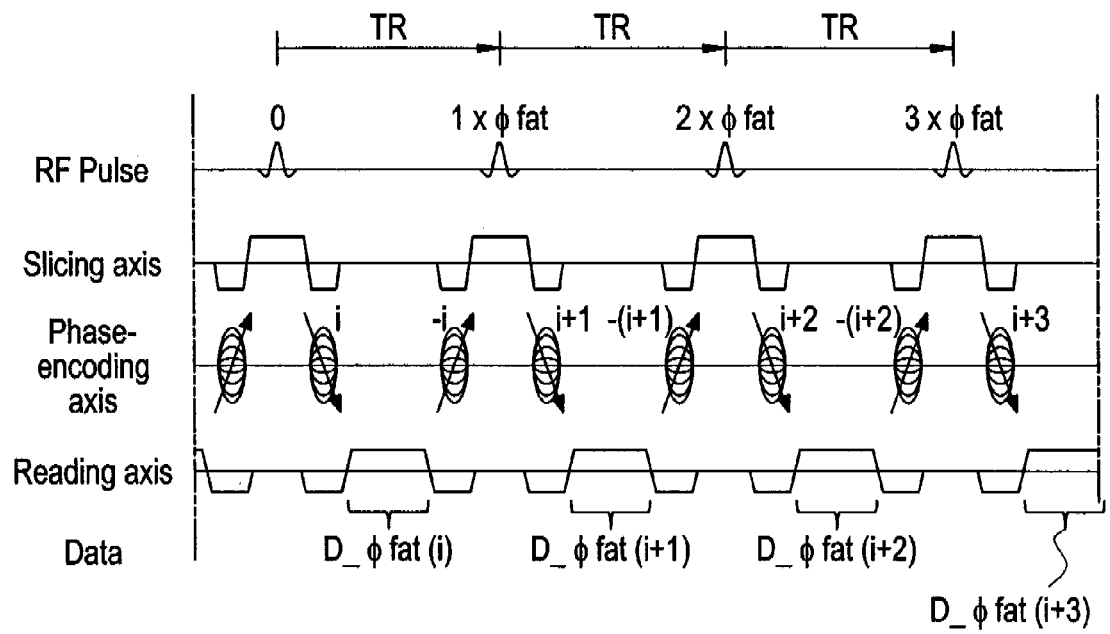
FIG. 3 is an explanatory diagram showing a normal steady-state pulse sequence employed in the first embodiment.
Figure 4:
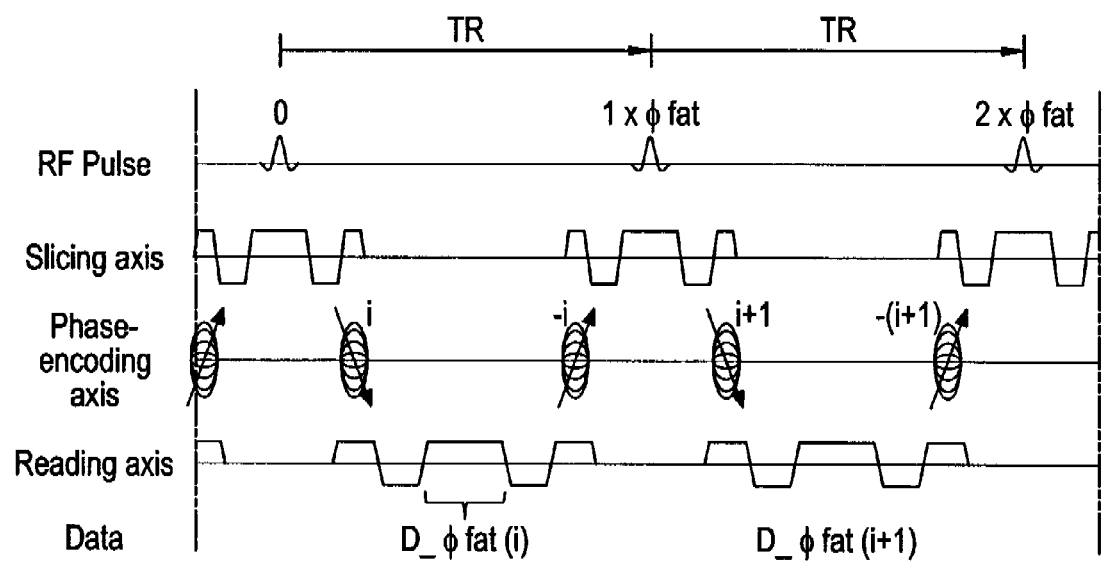
FIG. 4 is an explanatory diagram showing a steady-state pulse sequence devised in consideration of flow compensation and employed in the first embodiment.

At step A3, as shown in FIG. 3 or FIG. 4, data D_φfat is acquired according to a steady-state pulse sequence specifying that the phase of an RF pulse is varied in order of 0, 1×φfat, 2×φfat, etc.

FIG. 3 shows a normal steady-state pulse sequence, and FIG. 4 shows a steady-state pulse sequence determined in consideration of flow compensation.

Thereafter, data acquisition is terminated.

FIG. 5 is a flowchart describing image construction employed in the first embodiment.

At step B1, the computer 107 constructs an image Gw using data D_φfat.

Then, image construction is terminated.

FIG. 6 is an explanatory diagram concerning the aforesaid conceptual model adapted to the data D_φfat acquired according to the steady-state pulse sequence specifying φfat=3π/2 as shown in FIG. 3 or FIG. 4.

The spin echo component of an echo Ew induced by water leads the gradient echo component thereof by π/2. The spin echo component of an echo Ef induced by fat leads the gradient echo component thereof by −π.

Consequently, the echo Ew induced by water is enhanced but the echo Ef induced by fat is suppressed.

Eventually, a water component-enhanced/fat component-suppressed image Gw can be constructed using the data D_φfat.

SECOND EMBODIMENT

The second embodiment is fundamentally identical to the first embodiment. However, a magnetic field system shall offer a magnetic field strength of 1.5 T and the repetition time TR shall be set to 8.05 ms.

In this case, as shown in FIG. 7, m equals 1 and φfat equals π/2.

The spin echo component of an echo Ew induced by water leads the gradient echo component thereof by −π/2. The spin echo component of an echo Ef induced by fat leads the gradient echo component thereof by −π.

Consequently, the echo Ew induced by water is enhanced and the echo Ef induced by fat is suppressed.

Eventually, a water component-enhanced/fat component-suppressed image Gw can be constructed using the data D_φfat.

THIRD EMBODIMENT

Figure 8:
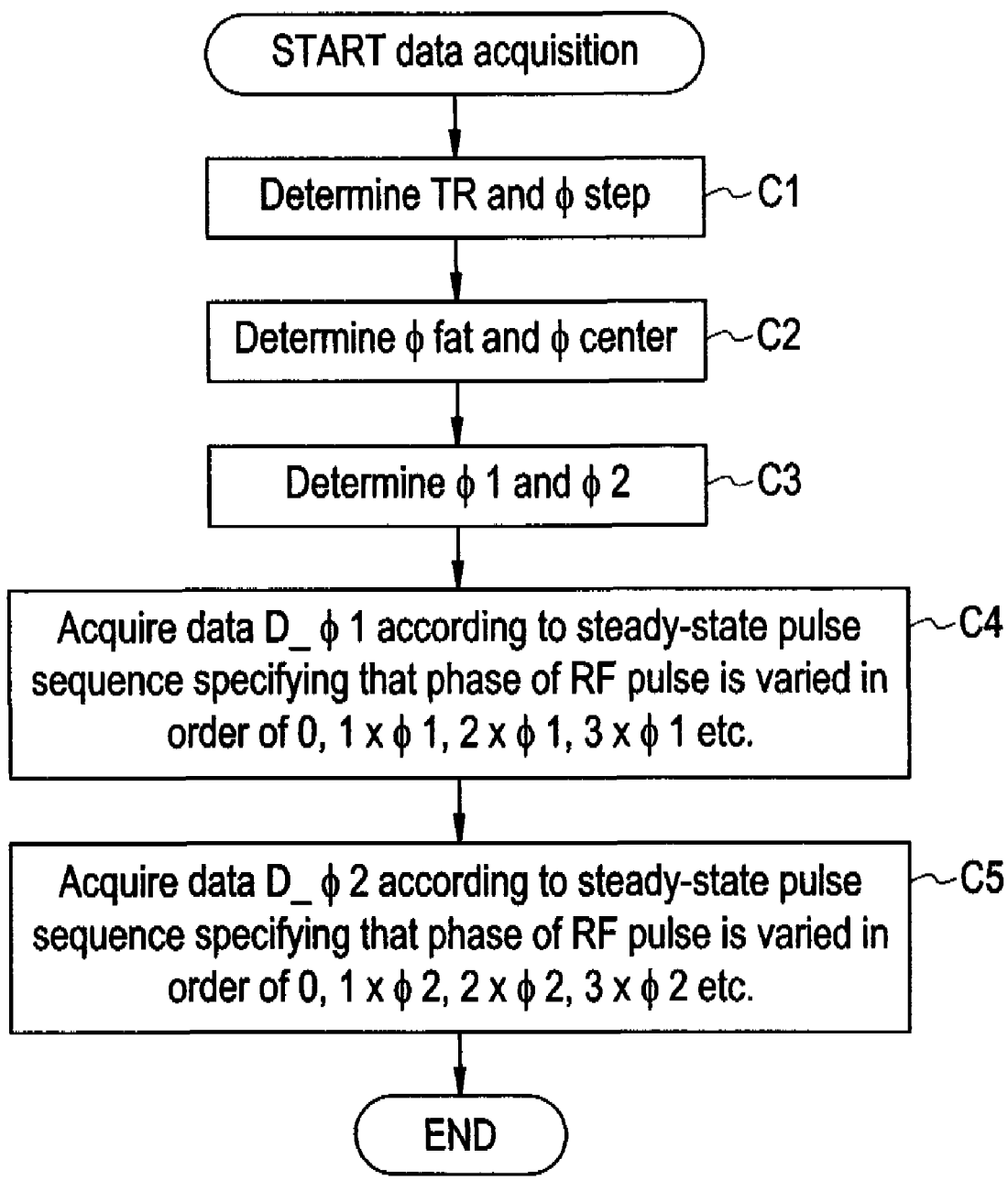
FIG. 8 is a flowchart describing data acquisition employed in the third embodiment.

FIG. 8 is a flowchart describing data acquisition employed in the third embodiment.

At step C1, the computer 107 determines the repetition time TR and φstep. For example, the options for the repetition time TR and the options for φstep are displayed on the display device 106, and an operator is prompted to select any of the options. φstep denotes a half of a phase width, that is, a half of the width of the portion of a line graph indicating a decrease in a signal strength S. Herein, the line graph expresses a change in the signal strength S in association with a change in a phase θ by which the spin echo component of an echo induced by water leads the spin echo component of an echo induced by fat.

Herein, a magnetic field system shall offer a magnetic field strength of 0.2 T, the repetition time TR shall be set to 10 ms, and φstep shall be set to π/4.

At step C2, φfat is determined according to φfat=(2−TR/T_out+2×m)×π where m denotes an integer equal to or larger than 0 and meets TR/(2×T_out)−1<m<TR/(2×T_out). Herein, T_out denotes the time during which spins in water and spins in fat are out of phase with each other due to chemical shifts.

Figure 9:
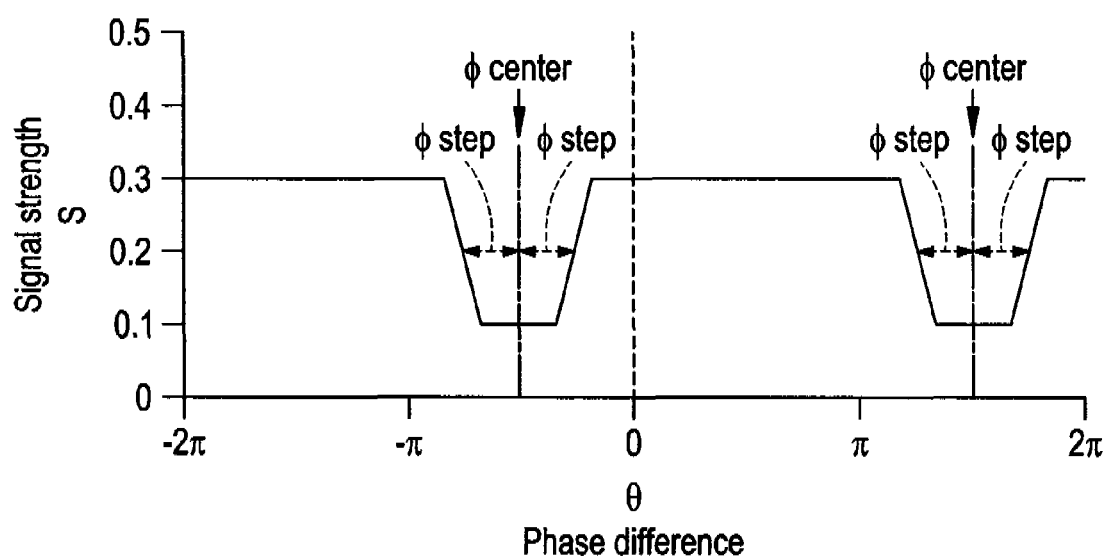
FIG. 9 is an explanatory diagram indicating $\phi$center and $\phi$step.

Moreover, φcenter is determined. φcenter denotes, as shown in FIG. 9, a center phase, that is, a phase difference associated with the center of the portion of a line graph indicating a decrease in a signal strength S. Herein, the line graph expresses a change in the signal strength S in association with a change in a phase difference θ by which the spin echo component of an echo induced by fat leads the spin echo component of an echo induced by water.

However, any of 0<φcenter<π, −π<φcenter<0, 0<φstep<π/2, and π/2<φstep<π shall be met.

Herein, the magnetic field system shall offer a magnetic field strength of 0.2 T and T_out shall be 20 ms. Assuming that the repetition time TR is 10 ms, m equals 0 and πfat equals 3π/2.

Moreover, φcenter=φfat=3π/2 shall be established.

At step C3, φ1 and φ2 are determined according to φ1=φcenter+φstep and φ2=φcenter−φstep respectively.

Herein, since φcenter equals 3π/2 and φstep equals π/4, φ1 comes to 7π/4 and φ2 comes to 5π/4.

Figure 10:
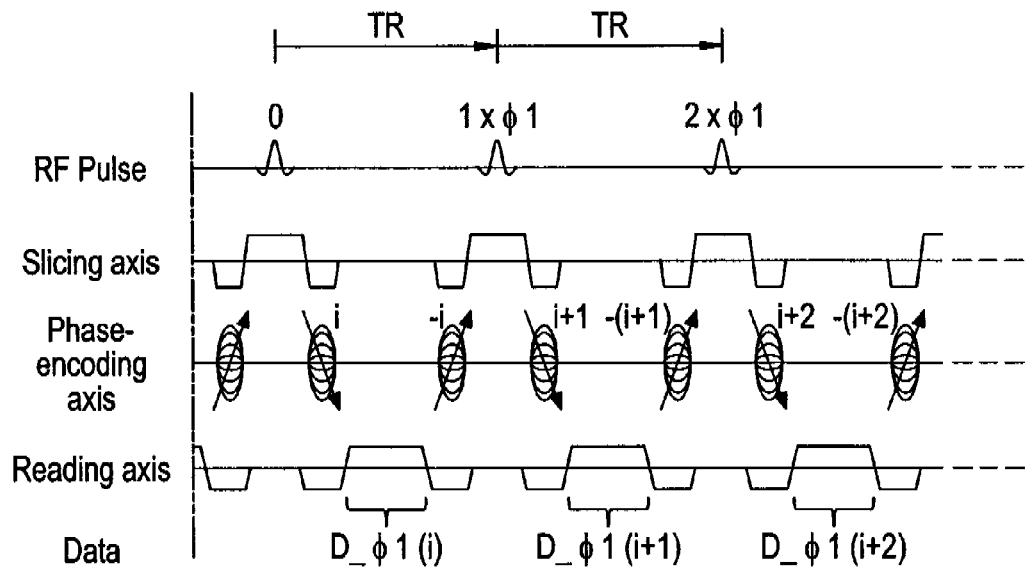
FIG. 10 is an explanatory diagram showing a first steady-state pulse sequence employed in the third embodiment.

At step C4, as shown in FIG. 10, data D_φ1 is acquired according to a steady-state pulse sequence specifying that the phase of an RF pulse is varied in order of 0, 1×φ1, 2×φ1, etc. Incidentally, FIG. 10 shows a normal steady-state pulse sequence. A steady-state pulse sequence determined in consideration of flow compensation may be substituted for the normal steady-state pulse sequence.

Figure 11:
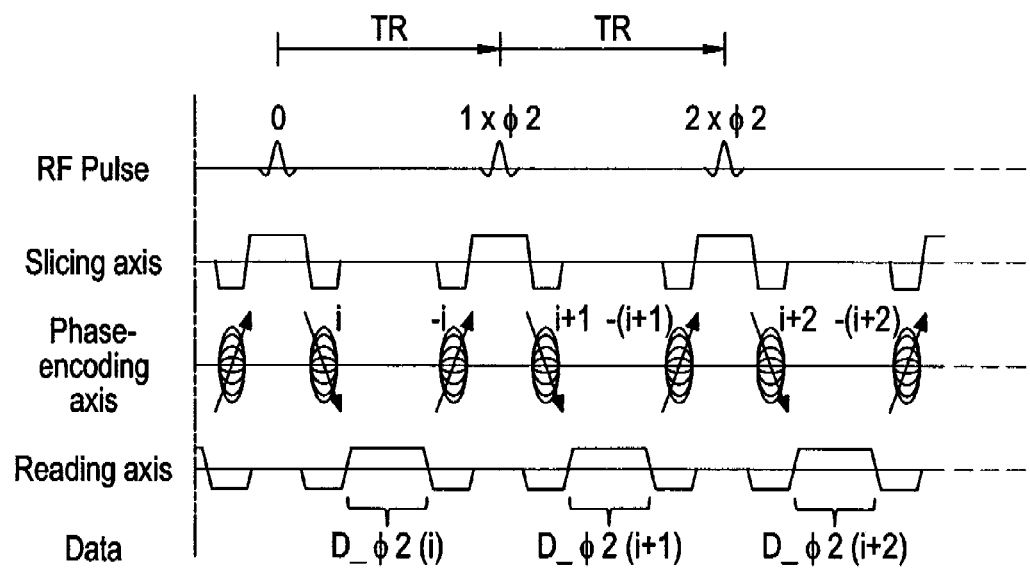
FIG. 11 is an explanatory diagram showing a second steady-state pulse sequence employed in the third embodiment.

At step C5, as shown in FIG. 11, data D_φ2 is acquired according to a steady-state pulse sequence specifying that the phase of an RF pulse is varied in order of 0, 1×φ2, 2×φ2, etc. Incidentally, FIG. 11 shows a normal steady-state pulse sequence. A steady-state pulse sequence determined in consideration of flow compensation may be substituted for the normal steady-state pulse sequence.

Data acquisition is then terminated.

Figure 12:
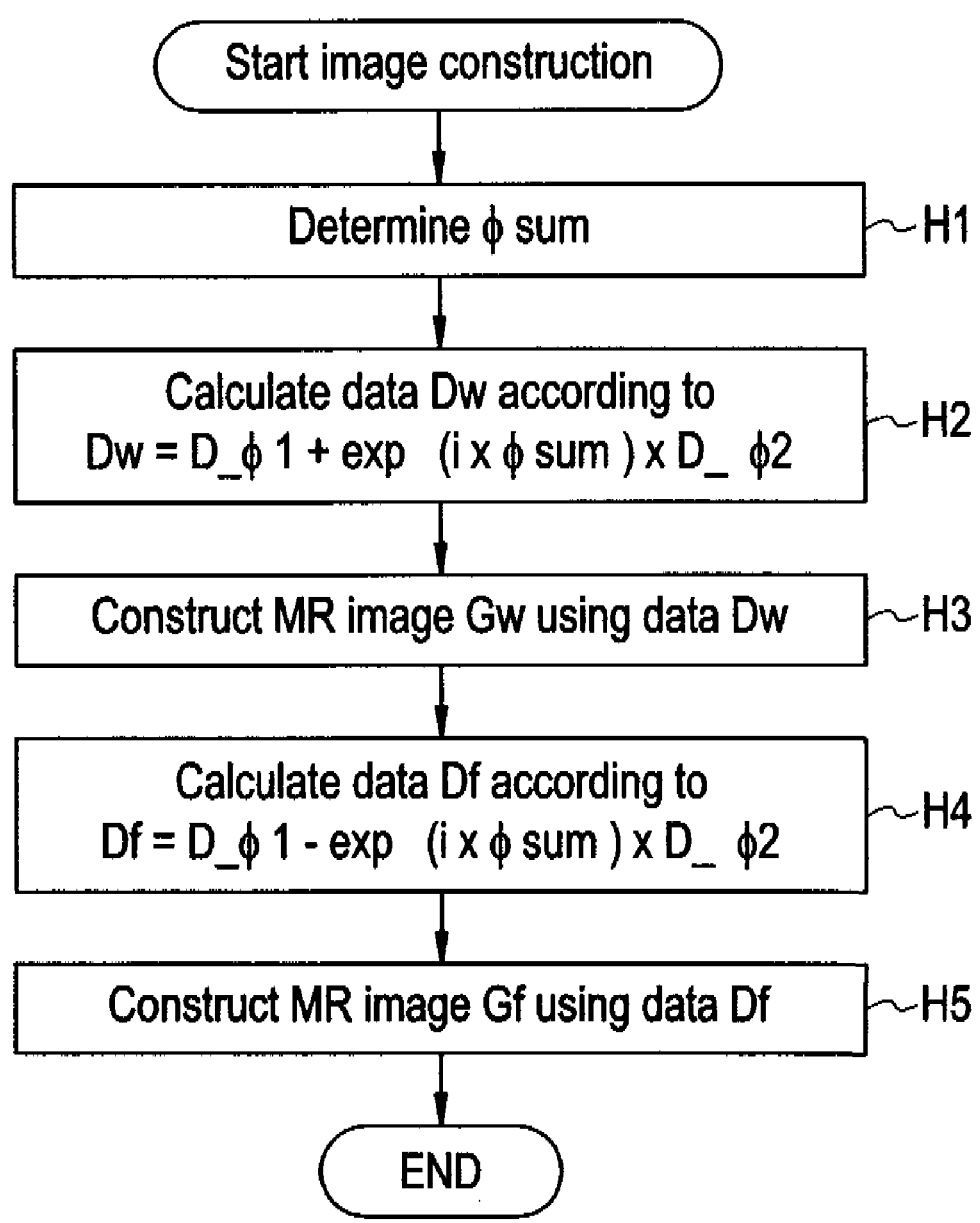
FIG. 12 is a flowchart describing image construction employed in the third embodiment.

FIG. 12 is a flowchart describing image construction employed in the third embodiment.

At step H1, the computer 107 determines φsum within the range of 0<φsum<π. φsum denotes a phase by which echoes represented by data D_φ2 are rotated.

Herein, φsum=φstep=π/4 shall be established.

At step H2, data Dw is produced according to Dw=D_φ1+exp(i×φsum)×D_φ2.

At step H3, an image Gw is constructed based on the data Dw.

At step H4, data Df is produced according to Df=D_φ1−exp(i×φsum)×D_φ2.

At step H5, an image Gf is constructed based on the data Df.

Image construction is then terminated.

FIG. 13 is an explanatory diagram concerning the aforesaid conceptual model adapted to the data D_φ1 acquired according to the steady-state pulse sequence specifying φ1=7π/4 as shown in FIG. 10.

The spin echo component of an echo Ew1 induced by water leads the gradient echo component thereof by 3π/4. The spin echo component of an echo Ef1 induced by fat leads the gradient echo component thereof by −3π/4.

FIG. 14 is an explanatory diagram concerning the aforesaid conceptual model adapted to the data D_φ2 acquired according to the steady-state pulse sequence specifying φ2=5π/4 as shown in FIG. 11.

The spin echo component of an echo Ew2 induced by water leads the gradient echo component thereof by π/4. The spin echo component of an echo Ef2 induced by fat leads the gradient echo component thereof by 3π/4.

As shown in FIG. 15, exp(i×φsum)×D_φ2 signifies that the echo Ew2 induced by water is rotated by φsum in order to produce an echo Ew2', and the echo Ef2 induced by fat is rotated by φsum in order to produce an echo Ef2'. In FIG. 15, φsum shall equal π/4.

Consequently, as shown in FIG. 16, data processing expressed as Dw=D_φ1+exp(i×φsum)×D_φ2 signifies that the echo Ew1 induced by water and the echo Ew2' are added up and the echo Ef1 induced by fat and the echo Ef2' are added up. Eventually, after the addition is completed, the resultant echo Ew induced by water is enhanced, and the resultant echo Ef induced by fat is suppressed.

On the other hand, data processing expressed as Df=D_φ1−exp(i×π/2)×D_φ2 signifies that the echo Ew2' is subtracted from the echo Ew1 induced by water and the echo Ef2' is subtracted from the echo Ef1 induced by fat. Eventually, after the subtraction is completed, the resultant echo Ew induced by water is suppressed and the resultant echo Ef induced by fat is enhanced.

As mentioned above, the third embodiment can construct a water component-enhanced/fat component-suppressed image Gw using data Dw and construct a fat component-enhanced/water component-suppressed image Gf using data Df.

FOURTH EMBODIMENT

The fourth embodiment is fundamentally identical to the third embodiment. φstep=π and φcenter=φfat shall be established. A magnetic field system shall offer a magnetic field strength of 1.5 T and a repetition time TR shall be set to 8.05 ms.

In this case, as shown in FIG. 17 and FIG. 18, m equals 1 and φfat equals π/2. Moreover, φ1 comes to 3π and φ2 comes to π/4.

As shown in FIG. 17, the aforesaid conceptual model is adapted to data D_φ1 acquired according to a steady-state pulse sequence specifying φ1=3π/4. The spin echo component of an echo Ew1 induced by water leads the gradient echo component thereof by −π/4. The spin echo component of an echo Ef1 induced by fat leads the gradient echo component thereof by −3π/4.

As shown in FIG. 18, the aforesaid conceptual model is adapted to data D_φ2 acquired according to a steady-state pulse sequence specifying φ2=π/4. The spin echo component of an echo Ew2 induced by water leads the gradient echo component thereof by −3π/4. The spin echo component of an echo Ef2 induced by fat leads the gradient echo component thereof by −5π/4.

As shown in FIG. 19, exp(i×φsum)×D_φ2 signifies that the echo Ew2 induced by water is rotated by φsum in order to produce an echo Ew2'. The echo Ef2 induced by fat is rotated by φsum in order to produce an echo Ef2'. In FIG. 19, φsum=φstep=π/4 shall be established.

As shown in FIG. 20, data processing expressed as Dw=D_φ1+exp(i×φsum)×D_φ2 signifies that the echo Ew1 induced by water and the echo Ew2' are added up and the echo Ef1 induced by fat and the echo Ef2' are added up. Consequently, after the addition is completed, the resultant echo Ew induced by water is enhanced and the resultant echo Ef induced by fat is suppressed.

On the other hand, data processing expressed as Df=D_φ1−exp(i×π/2)×D_φ2 signifies that the echo Ew2' is subtracted from the echo Ew1 induced by water and the echo Ef2' is subtracted from the echo Ef1 induced by fat. Consequently, after the subtraction is completed, the resultant echo Ew induced by water is suppressed and the resultant echo Ef induced by fat is enhanced.

As mentioned above, the fourth embodiment can construct a water component-enhanced/fat component-suppressed image Gw using the data Dw and a fat component-enhanced/water component-suppressed image Gf using the data Df.

FIFTH EMBODIMENT

The fifth embodiment is fundamentally identical to the third embodiment. A magnetic field system shall offer a magnetic field strength of 0.2 T, a repetition time Tr shall be set to 10 ms, φfat shall be set to π/2, and φcenter shall be set to π+φfat/2−φstep.

In this case, as shown in FIG. 21 and FIG. 22, φcenter equals 5π/4, φ1 equals 7π/4, and φ2 equals 3π/4.

As shown in FIG. 21, the aforesaid conceptual model is adapted to data D_φ1 acquired according to a steady-state pulse sequence specifying φ1=7π/4. The spin echo component of an echo Ew1 induced by water leads the gradient echo component thereof by 3π/4. The spin echo component of an echo Ef1 induced by fat leads the gradient echo component thereof by −3π/4.

As shown in FIG. 22, the aforesaid conceptual model is adapted to data D_φ2 acquired according to a steady-state pulse sequence specifying φ2=3π/4. The spin echo component of an echo Ew2 induced by water leads the gradient echo component thereof by −π/4. The spin echo component of an echo Ef2 induced by fat leads the gradient echo component thereof by −7π/4.

As shown in FIG. 23, exp(i×φsum)×D_φ2 signifies that the echo Ew2 induced by water is rotated by φsum in order to produce an echo Ew2', and the echo Ef2 induced by fat is rotated by φsum in order to produce an echo Ef2'. In FIG. 23, φsum=φstep=π/2 shall be established.

As shown in FIG. 24, data processing expressed as Dw=D_φ1+exp(i×φsum)×D_φ2 signifies that the echo Ew1 induced by water and the echo Ew2' are added up and the echo Ef1 induced by fat and the echo Ef2' are added up. Consequently, after the addition is completed, the resultant echo Ew induced by water is enhanced and the resultant echo Ef induced by fat is suppressed.

On the other hand, data processing expressed as Df=D_φ1−exp(i×π/2)×D_φ2 signifies that the echo Ew2' is subtracted from the echo Ew1 induced by water and the echo Ef2' is subtracted from the echo Ef1 induced by fat. Consequently, after the subtraction is completed, the resultant echo Ew induced by water is suppressed and the resultant echo Ef induced by fat is enhanced.

As mentioned above, the fifth embodiment can construct a water component-enhanced/fat component-suppressed image Fw using data Dw and a fat component-enhanced/water component-suppressed image Gf using data Df.

SIXTH EMBODIMENT

The sixth embodiment is fundamentally identical to the fourth embodiment. A magnetic field system shall offer a magnetic field strength of 1.5 T, a repetition time TR shall be set to 8.05 ms, φfat shall be set to π/2, φcenter shall be set to π, and φstep shall be set to 3π/4.

In this case, as shown in FIG. 25 and FIG. 26, φ1 equals 7π/4 and φ2 equals π/4.

As shown in FIG. 25, the aforesaid conceptual model is adapted to data D_φ1 acquired according to a steady-state pulse sequence specifying φ1=7π/4. The spin echo component of an echo Ew1 induced by water leads the gradient echo component thereof by 3π/4. The spin echo component of an echo Ef1 induced by fat leads the gradient echo component thereof by π/4.

As shown in FIG. 26, the aforesaid conceptual model is adapted to data $D\_\phi 2$ acquired according to a steady-state pulse sequence specifying $\phi 2=\pi/4$. The spin echo component of an echo Ew2 induced by water leads the gradient echo component thereof by $-3\pi/4$. The spin echo component of an echo Ef2 induced by fat leads the gradient echo component thereof by $-5\pi/4$.

As shown in FIG. 27, $\exp(i\times\phi sum)\times D\_\phi 2$ signifies that the echo Ew2 induced by water is rotated by $\phi sum$ in order to produce an echo Ew2', and the echo Ef2 induced by fat is rotated by $\phi sum$ in order to produce an echo Ef2'. In FIG. 27 $\phi sum=\phi step=3\pi/4$ shall be established.

As shown in FIG. 28, data processing expressed as $Dw=D\_\phi 1+\exp(i\times\phi sum)\times D\_\phi 2$ signifies that the echo Ew1 induced by water and the echo Ew2' are added up and the echo Ef1 induced by fat and the echo Ef2' are added up. Consequently, after the addition is completed, the resultant echo Ew induced by water is enhanced and the resultant echo Ef induced by fat is suppressed.

On the other hand, data processing expressed as $Df=D\_\phi 1-\exp(i\times\pi/2)\times D\_\phi 2$ signifies that the echo Ew2' is subtracted from the echo Ew1 induced by water and the echo Ef2' is subtracted from the echo Ef1 induced by fat. Consequently, after the subtraction is completed, the resultant echo Ew induced by water is suppressed and the resultant echo Ef induced by fat is enhanced.

As mentioned above, the sixth embodiment can construct a water component-enhanced/fat component-suppressed image Gw using data Dw and a fat component-enhanced/water component-suppressed image Gf using data Df.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MR data acquisition method for acquiring data $D\_\phi fat$ according to a steady-state pulse sequence specifying that the phase of an RE pulse is varied in order of 0, $1\times\phi fat$, $2\times\phi fat$, etc., wherein:
   $\phi fat=(2-TR/T\_out+2\times m)\times\pi$ is established on the assumption that m denotes an integer equal to or larger than 0 and meets $TR/(2\times T\_out)-1<m<TR/(2\times T\_out)$ where TR denotes a repetition time and T_out denotes the time during which spins in water and spins in fat are out of phase with each other due to chemical shifts.

2. An MR image construction method for constructing an MR image Gw using data D_fat, said method comprising:
   acquiring data $D\_\phi fat$ according to a steady-state pulse sequence specifying that a phase of an RF pulse is varied in order of 0, $1\times\phi fat$, $2\times\phi fat$, etc., wherein:
   $\phi fat=(2-TR/T\_out+2\times m)\times\pi$ is established on an assumption that m denotes an integer equal to or larger than 0 and meets $TR/(2\times T\_out)-1<m<TR/(2\times T\_out)$, where TR denotes a repetition time and T_out denotes a time during which spins in water and spins in fat are out of phase with each other due to chemical shifts; and
   constructing the MR image using the acquired data.

3. An MRI system comprising:
   a data acquisition device that when $\phi fat=(2-TR/T\_out+2\times m)\times\pi$ is established on the assumption that m denotes an integer equal to or larger than 0 and meets $TR/(2\times T\_out)-1<m<TR/(2\times T\_out)$ where TR denotes a repetition time and T_out denotes the time during which spins in water and spins in fat are out of phase with each other due to chemical shifts, acquires data $D\_\phi fat$ according to a steady-state pulse sequence specifying that the phase of an RF pulse is varied in order of 0, $1\times\phi fat$, $2\times\phi fat$, etc.

4. An MRI system according to claim 3, further comprising an image construction device for constructing an MR image Gw using data D_fat.

* * * * *